(12) United States Patent
Kwak et al.

(10) Patent No.: US 8,026,667 B2
(45) Date of Patent: Sep. 27, 2011

(54) ELECTROLUMINESCENCE DISPLAY DEVICE HAVING ELECTRODE POWER SUPPLY LINE

(75) Inventors: Won-Kyu Kwak, Seongnam-si (KR); Kwan-Hee Lee, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 467 days.

(21) Appl. No.: 11/073,757

(22) Filed: Mar. 8, 2005

(65) Prior Publication Data

US 2005/0200270 A1 Sep. 15, 2005

(30) Foreign Application Priority Data

Mar. 9, 2004 (KR) ........................ 10-2004-0015736

(51) Int. Cl.
*H01J 1/62* (2006.01)
(52) U.S. Cl. ..................... 313/506; 313/500; 313/505
(58) Field of Classification Search .......... 313/498–512
See application file for complete search history.

(56) References Cited

U.S. PATENT DOCUMENTS

| | | | |
|---|---|---|---|
| 2001/0026757 A1 | 10/2001 | Marx et al. | |
| 2002/0005696 A1* | 1/2002 | Yamazaki et al. | 315/169.3 |
| 2002/0158835 A1 | 10/2002 | Kobayashi et al. | |
| 2003/0062519 A1 | 4/2003 | Yamazaki et al. | |
| 2003/0071563 A1 | 4/2003 | Hamada | |
| 2003/0089991 A1* | 5/2003 | Yamazaki et al. | 257/759 |
| 2003/0201728 A1 | 10/2003 | Miyajima | |
| 2003/0222589 A1 | 12/2003 | Osame et al. | |
| 2004/0017149 A1* | 1/2004 | Matsumoto et al. | 313/500 |
| 2005/0099113 A1* | 5/2005 | Yamada | 313/504 |

FOREIGN PATENT DOCUMENTS

| | | |
|---|---|---|
| CN | 1319892 | 10/2001 |
| CN | 1329368 | 1/2002 |
| CN | 1432984 | 7/2003 |
| CN | 1458640 | 11/2003 |
| EP | 1176457 | 1/2002 |
| JP | 2002-110343 | 4/2002 |
| JP | 2003-249353 | 9/2003 |
| JP | 2003-271075 | 9/2003 |
| JP | 2003255845 | 9/2003 |
| WO | 03-060858 | 7/2003 |

OTHER PUBLICATIONS

Chinese Office Action dated Sep. 5, 2008.
European Search Report dated Oct. 8, 2008.
Third Office Action issued by the State Intellectual Property Office of the People's Republic of China on Jan. 15, 2010 in Chinese Patent Application No. 200510065521.6.
Chinese Registration Determination Certificate dated Jul. 13, 2011.

* cited by examiner

*Primary Examiner* — Bumsuk Won
(74) *Attorney, Agent, or Firm* — H.C. Park & Associates, PLC

(57) ABSTRACT

An electroluminescent display device may include a display area formed on one surface of a substrate. It may further include a first electrode layer, a second electrode layer, and an electroluminescent emission layer between the first and second electrode layers. It may also include an electrode power supply line that supplies electrode power to the display area. The electrode power supply line can be located at least partially on an outer periphery of the display area, and may directly contact the second electrode layer. An electrical component may be arranged under the electrode power supply line, and may have one or more conductive layers.

13 Claims, 8 Drawing Sheets

US 8,026,667 B2

ELECTROLUMINESCENCE DISPLAY DEVICE HAVING ELECTRODE POWER SUPPLY LINE

BACKGROUND OF THE INVENTION

This application claims the priority of Korean Patent Application No. 2004-15736, filed Mar. 9, 2004, which is incorporated herein in its entirety by reference.

1. Field of the Invention

The present invention relates to a flat panel display. More particularly, it relates to an electroluminescence display device that can increase the proportion of display area by reducing a voltage drop that can occur when supplying voltage to electrodes.

2. Description of the Related Art

In displaying an image, a variety of display devices are used and, in recent years, there have been numerous kinds of display devices available. Among these display devices, the organic electroluminescent device (a flat emissive-type display device that does not require a separate emission device such as a backlight) has become popular because it enables highly is efficient operation with low power consumption and is capable of blue emission.

The electroluminescence display device utilizes the light emission principle in which, when an electric field is applied between the two electrodes, electrons are injected from the cathode side and holes are injected from the anode side. The electrons are recombined with the holes in the light emitting layer to form an excited state and energy generated when the excited state returns to the ground state is emitted as light.

In an electroluminescence display device, an organic electroluminescent portion includes several layers stacked on a substrate, including a first electrode, that is, an anode, an organic light-emitting portion, and a second electrode, that is, a cathode. The organic light-emitting portion includes an organic emission layer (EML), in which recombination of holes and electrons occurs to form excitons and generate light.

In order to increase emission efficiency, it can be useful to facilitate migration of holes and electrons to an organic emission layer. To this end, an electron transport layer (ETL) may be disposed between the cathode and the organic emission layer, and a hole transport layer (HTL) may also be disposed between the anode and the organic emission layer. Also, a hole injection layer (HIL) may be disposed between the anode and the HTL, and an electron injection layer (EIL) may be disposed between the cathode and the ETL.

There are passive matrix-type (PM) and active matrix-type (AM) organic electroluminescent displays. The passive-matrix type EL device may be simply constructed such that anodes and cathodes are arranged in columns and rows. Scanning signals can be supplied to the cathodes from a row driver. A single row can be selected from a plurality of rows. Data signals can be applied to each pixel from a column driver. The active matrix type EL device controls signals input to each pixel using thin film transistors (TFTs) and is suitable for processing a large quantity of signals, and thus is widely used as a motion picture display device.

In an organic/inorganic electroluminescent display device, particularly, in an active matrix type organic/inorganic electroluminescent device, a problem is presented that a proportion of a display area including pixels relative to a substrate is reduced due to lay-out of various driving circuits and wirings substrate.

FIG. 1A is a plan view of a general active matrix type electroluminescence display device. FIG. 1B is a cross-sectional view taken along the line I-I shown in FIG. 1A.

The active matrix type electroluminescence display device shown in FIGS. 1A and 1B includes a predetermined display area 20 having an organic electroluminescent device on a transparent insulating substrate 10. In order to seal the display area 20, a metal cap 90 may be sealed by a sealing portion 80 having a sealing member 81.

The organic electroluminescent device including thin film transistors has a plurality of pixels arranged in the display area 20 and a cathode electrode 40 disposed on the display area 20. The cathode electrode 40 can be connected to an external terminal region 70 through an electrode wiring portion 41 provided at one side of the display area 20. Also, the display area 20 can have a plurality of driving lines (VDD) 31 arranged thereon. The driving lines 31 are connected to the terminal region 70 through a driving power wiring portion 30 outside the display area 20, and supply driving power to the display area 20. Also, a vertical circuit portion 50 and a horizontal circuit portion 60 for applying signals to TFTs of the display area 20 are further provided outside the display area 20, and are both connected to the terminal region 70 by circuit wiring portions 51 and 61, respectively.

In the aforementioned active matrix type electroluminescence display device, the metal cap 90 as a sealing member seals the entire region excluding the terminal region 70, including the wiring portions 51 and 61 and the circuit portions 50 and 60 as well as the display area 20. As a result, the sealing portion 80 encapsulates not only the display area 20, which is an image display portion, but also a non-image display portion, that is, the wiring portions 51 and 61 and the circuit portions 50 and 60. This lowers a proportion of the display area 20 relative to the overall size of the display device, resulting in an increase in dead space (i.e. non-emissive region).

The above-noted problems are described in Korean Patent Publication No. 2001-83213. Here, a protective electrode as a cathode is connected to an external FPC through a wiring structure disposed at the edge of a sealing portion, occupying a considerable area of the edge of the sealing portion.

To overcome such a lay-out problem, the electroluminescence display device shown in FIGS. 1A and 1B is constructed such that a width of the wiring portion 51, 61 that connects the display area 20 and the terminal region 70 is reduced. This design, however, increases resistance of the wiring portion 51, 61, resulting in deterioration of luminance.

Japanese Patent Publication No. 2003-316284 discloses a liquid crystal display device with a reduced panel size, in which liquid crystals are injected between a substrate having common electrodes arranged thereon and a substrate having pixel electrodes arranged thereon to then be sealed. A gap between the substrates provided for injection of the liquid crystals may cause a step difference between the common electrodes and power supply lines for supplying power to the common electrodes, and disconnection between the common electrodes and the power supply lines may occur due to such a step difference. This disconnection may result in a considerable voltage drop, leading to deterioration of luminance in the display area.

SUMMARY OF THE INVENTION

The present invention provides an electroluminescent display device that has an increased ratio of display area to substrate area and can reduce nonuniformity or deterioration in luminance throughout the display area due to voltage drop.

The present invention provides, for example, an electroluminescent display device including a display area formed on one surface of a substrate with a first electrode layer and a second electrode layer (each of which consists of one or more layers respectively), as well as an electroluminescent portion having an emission layer between the first and second electrode layers. It can also include an electrode power supply line that supplies electrode power to the display area with one or more layers arranged along at least a portion of an outer periphery of the display area, and with at least a portion contacting the second electrode layer directly. It can further include an electrical component that has one or more conductive layer arranged under the electrode power supply line.

A pixel definition layer of the display area may extend to be interposed between the second electrode layer and the electrode power supply line. The second electrode layer and the electrode power supply line may directly contact each other through an opening formed on at least a portion of the pixel definition layer over the electrode power supply line. The opening may be formed as a closed curve along an outer periphery of the display area.

The second electrode layer and the electrode power supply line may be in plane-contact. The electrical component may include a driver circuit portion for applying an electric signal to the display area. The electrical component may include a driving power supply line for supplying driving power to the display area. The light generated from the emission layer may be emitted through the substrate.

Alternatively, the light generated from the emission layer may be emitted through a sealing substrate (e.g. a substrate for establishing a seal together with the substrate). In this case, the first electrode layer can include one or more layers containing a conductive reflective film. The electrode power supply line may be formed of one or more layers, and may contain the conductive reflective film. The conductive reflective film may be a metal layer. The conductive reflective film may have a thickness of approximately 1000 Å or greater.

DETAILED DESCRIPTION OF THE INVENTION

The present invention will now be described in more detail with reference to the drawings showing examples of specified preferred embodiments. "A layer" can refer to a single layer or to a multi-layer structure. When one layer is described as "on" another, it can be directly on the other, or the two layers may be separated by one or more intervening layers. "Substantial" as used herein, can refer to an amount up to and including the whole amount.

Figure 1A:
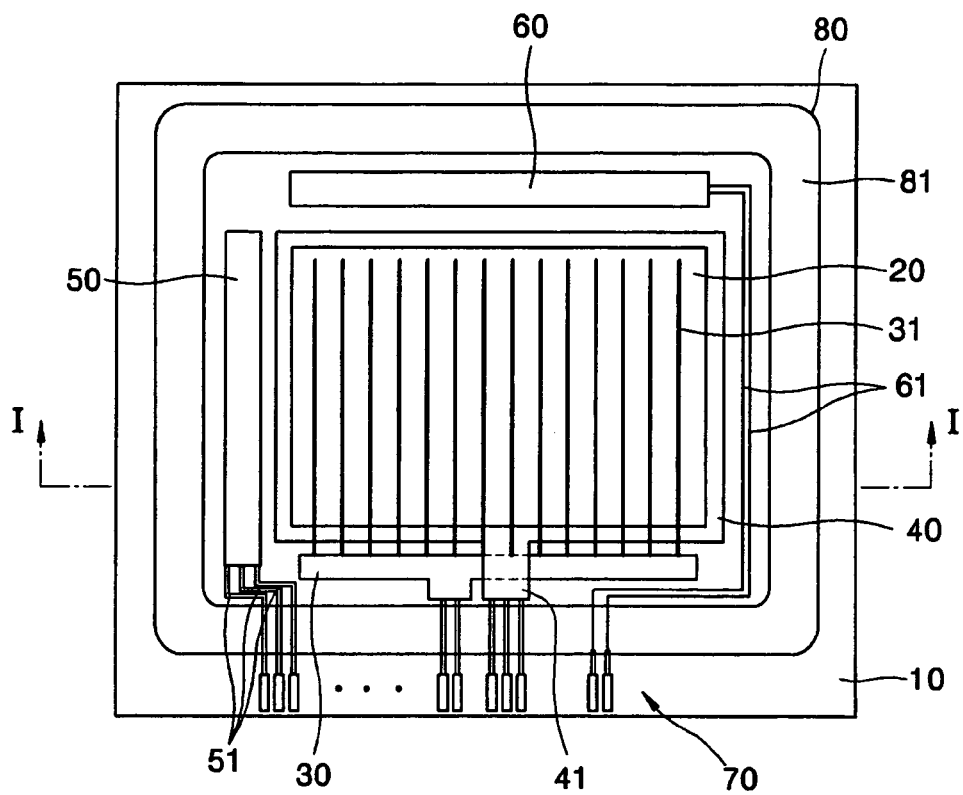
FIG. 1A is a schematic plan view of a conventional electroluminescence display device.
Figure 1B:
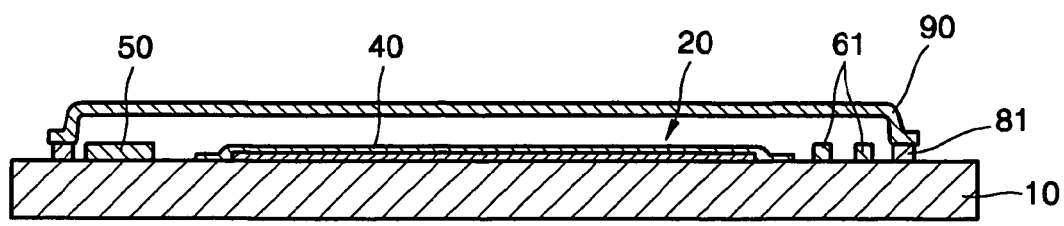
FIG. 1B is a schematic cross-sectional view taken along line I-I shown in FIG. 1A.
Figure 2A:
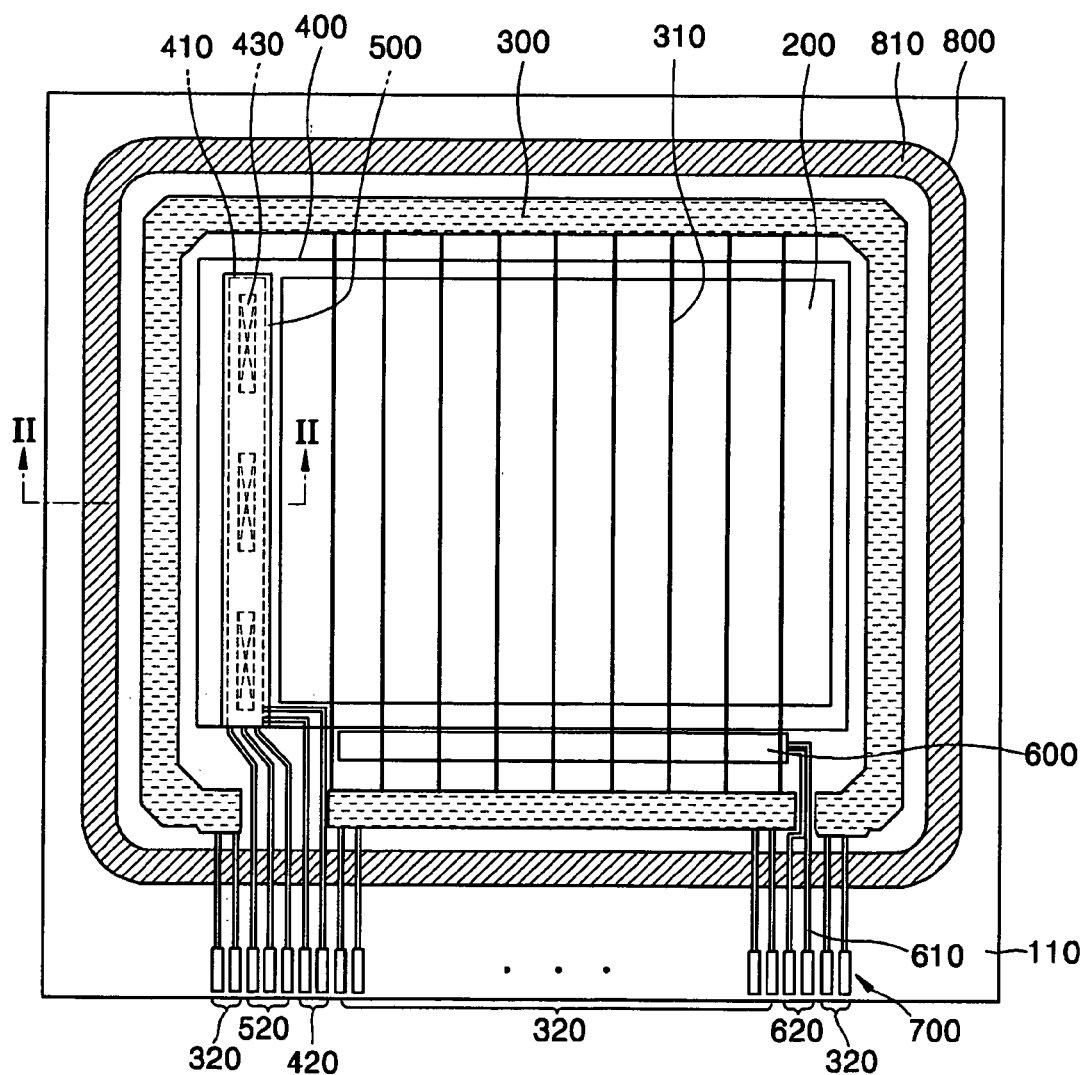
FIG. 2A is a schematic plan view of an electroluminescence display device according to an embodiment of the present invention.

As shown in FIG. 2A, on one plane of a substrate 110 the following are provided: a display area 200 where a light-emitting device (such as an electroluminescence display device) is disposed, a sealing portion 800 coated on an outer periphery of the display area 200 (for sealing a substrate 110 and a sealing substrate (900 shown in FIG. 2B), an a terminal region 700 having various terminals. The sealing substrate 900 may be replaced by a sealing thin film layer.

A structure of the electroluminescence display device forming the display area 200 will be described with reference to FIG. 2B. A buffer layer 120 made of $SiO_2$ may be formed on a substrate (for example, a glass substrate 110). A semiconductor active layer 130 may be formed on one plane of the buffer layer 120. The semiconductor active layer 130 may be an amorphous silicon layer or a polycrystalline silicon layer. Although not shown in detail, the semiconductor active layer 130 includes source and drain regions doped with N+ type or P+ type dopants, and a channel region. The semiconductor active layer 130 may include, but is not limited to an organic semiconductor.

A gate electrode 150 may be formed at a location corresponding to the channel region on one plane of the semiconductor active layer 130. The channel region may be electrically connected or disconnected according to signal applied to the gate electrode 150, by which source and drain regions are connected to each other.

The gate electrode 150 may preferably be formed of MoW, Al/Cu, or the like, in view of adhesion to adjacent layers, planarity of the surface on which the gate electrode 150 is stacked, processability, and so on. In order to ensure insulating properties of the semiconductor active layer 130 and the gate electrode 150, a gate insulating layer 140 made of silicon oxide ($SiO_2$) may be interposed between the semiconductor active layer 130 and the gate electrode 150. This may be accomplished, for example, by plasma enhanced chemical vapor deposition (PECVD).

An interlayer 160 may be formed on the gate electrode 150. The interlayer 160 may be a single layer or double layers made of a material such as $SiO_2$ or SiNx. Source/drain electrodes 170 may be formed on the interlayer 160. The source/drain electrodes 170 may be electrically connected to a source region and a drain region in the semiconductor active layer via contact holes formed in the interlayer 160 and the gate insulating layer 140, respectively.

A protective layer 180 (for example, a passivation layer or a planarization layer) that may serve as an insulating layer may be formed on the source/drain electrodes 170 and may protects or planarize underlying TFTs. The protective layer 180 of the illustrative embodiment of the present invention may be made of various materials. For example, the protective layer 180 may be formed of either an inorganic material or an organic material. Also, the protective layer 180 may have a single, or multi-layer (two or more layers) structure having a lower SiNx layer and an upper organic material layer made of benzocyclobutene (BCB) or acryl.

A first electrode layer 210 may be disposed on one plane of the protective layer 180. One end of the first electrode layer 210 may be connected to the drain electrode 170 formed beneath it. It may be connected through a via hole 211 formed in the protective layer 180. The first electrode layer 210, if it is of a bottom emission type, may, for example, be formed of a transparent electrode made of indium tin oxide (ITO). If it is a top emission type, the first electrode layer 210 may be formed of a variety of modified electrodes. For example, Mg:Ag/ITO may be deposited as the first electrode layer 210.

The organic electroluminescent portion 230 may include a low-molecular or high-molecular organic layer. When the low-molecular organic layer is used, a hole injection layer (HIL), a hole transport layer (HTL), an organic emission layer (EML), an electron transport layer (ETL), or an electron injection layer (EIL) may be stacked in a single or composite structure. Various organic materials, including copper phthalocyanine (CuPc), N,N'-Di(naphthalene-1-yl)-N,N'-diphenyl-benzidine (NPB), tris-8-hydroxyquinoline aluminum ($Alq_3$) and the like, can be used. These low-molecular organic layers can be formed by vacuum deposition.

When the high-molecular organic layer is used, the organic electroluminescent portion 230 usually has a hole transport layer (HTL) and an organic emission layer (EML). In this case, PEDOT may be used as the hole transport layer, and poly-phenylenevinylene based (PPV) or polyfluorene based high-molecular organic material can be used as an emission layer. Screen printing or inkjet printing may be employed to form these layers.

A cathode electrode 400 may be entirely deposited on one plane of the organic electroluminescent portion 230. According to emission type, Al/Ca, ITO, or Mg—Ag may also be used for the cathode electrode 400. The cathode electrode 400 may be formed of multiple layers rather than a single layer. Also, the cathode electrode 400 may further include an alkali or alkali earth metal fluoride layer, e.g., an LiF layer, or other various types of layers.

As shown in FIG. 2A, a driving power supply line 300 for supplying driving power to the display area 200 may be provided between the display area 200 and the sealing portion 800. FIG. 2A shows the arrangement of a driving power supply line according to an exemplary embodiment of the present invention. However, the invention is not limited to the illustrative arrangement, but driving power may be uniformly distributed throughout the display area to solve the problem of nonuniformity in luminance.

Thus, the driving power supply line 300 may be formed so as to surround the display area. The driving power supply line 300 may be connected to a driving line 310. The driving line 310 may be arranged across the display area 200 and may be electrically connected to the source electrode (170 shown in FIG. 2B) disposed under the protective layer 180.

Also, vertical driver 500 and horizontal driver 600 may be disposed outside the display area 200. The vertical driver 500 may be a scanning driver circuit portion for applying a scan signal to the display area 200. The horizontal driver 600 may be a data driver circuit portion for applying a data signal to the display area 200. In some cases, the vertical and horizontal drivers 500 and 600 may be implemented as external integrated circuits (ICs) or chip on glass (COG). As dead space is reduced in the present invention, and in view of cost reduction and structural simplicity, the vertical/horizontal drivers 500 and 600 may be integrally formed with the display area 200.

Meanwhile, an electrode power supply line 410 for supplying electrode power to the display area 200 may be provided at least at a portion along the outer periphery of the display area 200. The electrode power supply line 410 may be formed of the same material as the first electrode layer 210 of the display area 200. That is, the electrode power supply line 410 may be formed simultaneously with the first electrode layer 210.

Also, the electrode power supply line 410 may be brought into direct contact with a second electrode layer 400 to be formed in a subsequent step, which may help solve problems with the prior art due to poor contact or voltage drop. Also, an electrical component having one or more conductive layers (for example, a vertical driver 500) may be provided at the lower portion of the electrode power supply line 410. Thus, unlike in the prior art in which electrode power supply lines are independently arranged so as not to overlap with other components, the electrode power supply line 410 according to an embodiment of the present invention may be arranged over the electrical component (e.g., the vertical driver 500). This obviates the need for specially arranging the electrode power supply line 400 that was present in the prior art. Thus, the ratio of display area to substrate can be improved. This can be implemented by using a smaller substrate for the same display size, or a larger display size for the same substrate.

The electrode power supply line 410 and the second electrode layer 400 may be electrically connected to each other by various methods. In order to prevent voltage drop due to contact resistance between the electrode power supply line 410 and the second electrode layer 400, the electrode power supply line 410 and the second electrode layer 400 may be electrically connected to each other in a plane-contact manner (surface-contact manner). That is, a contact region between the second electrode layer and electrode power supply line may occupy substantially the width of the electrode power supply line 410.

Figure 2B:
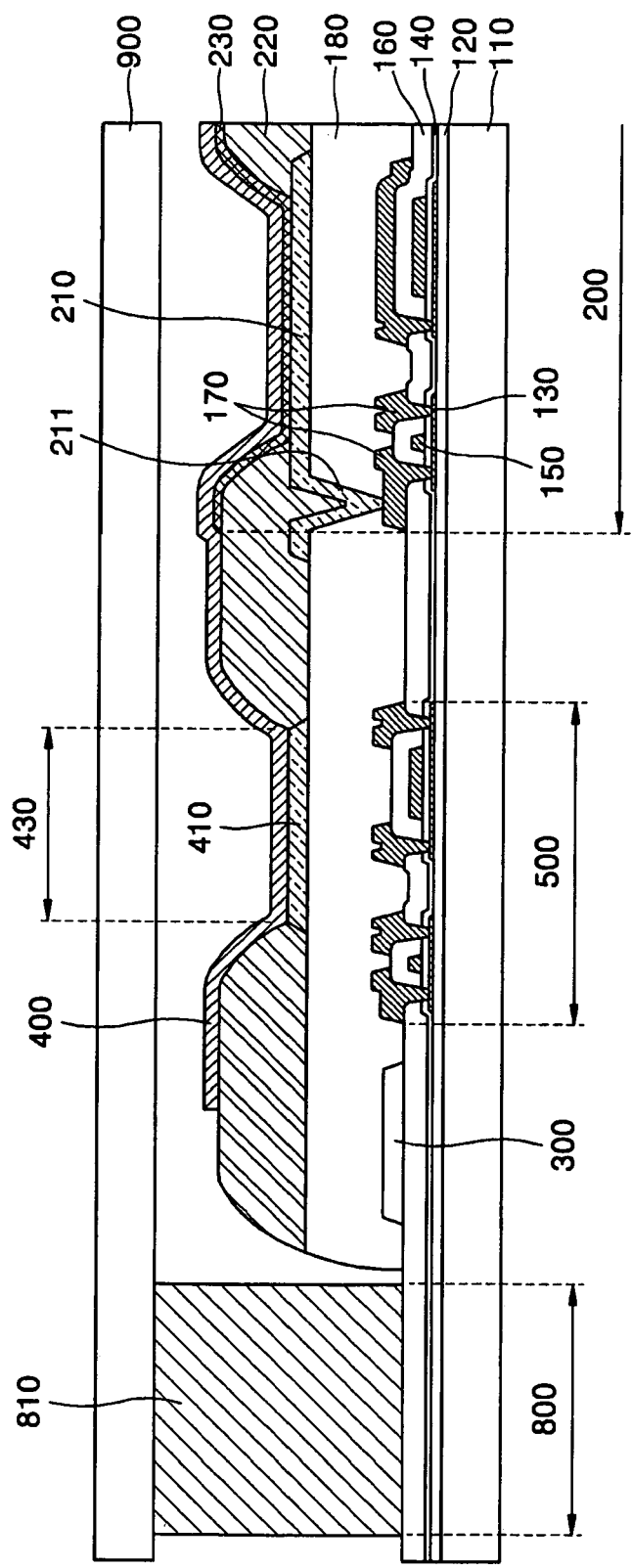
FIG. 2B is a schematic cross-sectional view taken along line II-II shown in FIG. 2A.

As shown in FIG. 2B, a pixel definition layer 220 that defines a pixel region of a is display area 200 may extend to be interposed between the second electrode layer 400 and the electrode power supply line 410. The second electrode layer 400 may extend over the electrode power supply line 410 toward the outer periphery of the display area 200. An opening 430 may be formed on at least a portion of the pixel definition layer 220 over the electrode power supply line 410. The second electrode layer 400 and the electrode power supply line 410 may directly contact each other, preferably in a plane-contact manner, at the opening 430.

FIG. 2A shows the electrode power supply line 410 as an electrical component including one or more conductive layers among conductive layers in the display area 200. The electrode power supply line 410 can overlap the vertical driver 500 when viewed in a direction from the sealing substrate 900 to the substrate 110.

Figure 3:
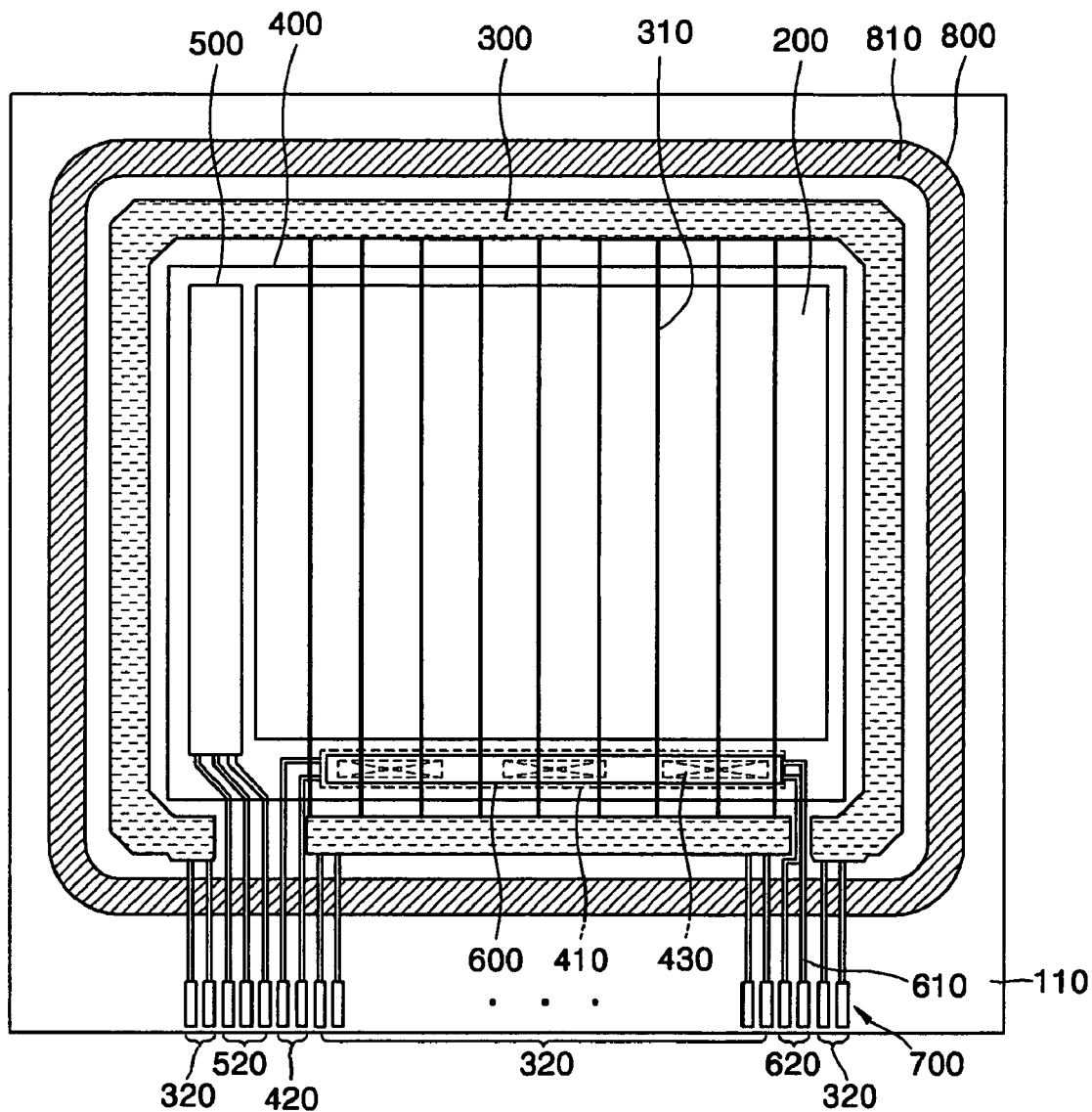
FIG. 3 is a schematic plan view of an electroluminescence display device according to another embodiment of the present invention.

As shown in FIG. 3, the electrode power supply line 410 may be disposed over a horizontal circuit portion 600 for applying a data signal to the display area 210. Alternatively, the electrode power supply line 410 may also be disposed in various manners, overlapping other wiring. A variety of modifications are possible depending on the lay-out designs of various driver circuits.

Figure 4A:
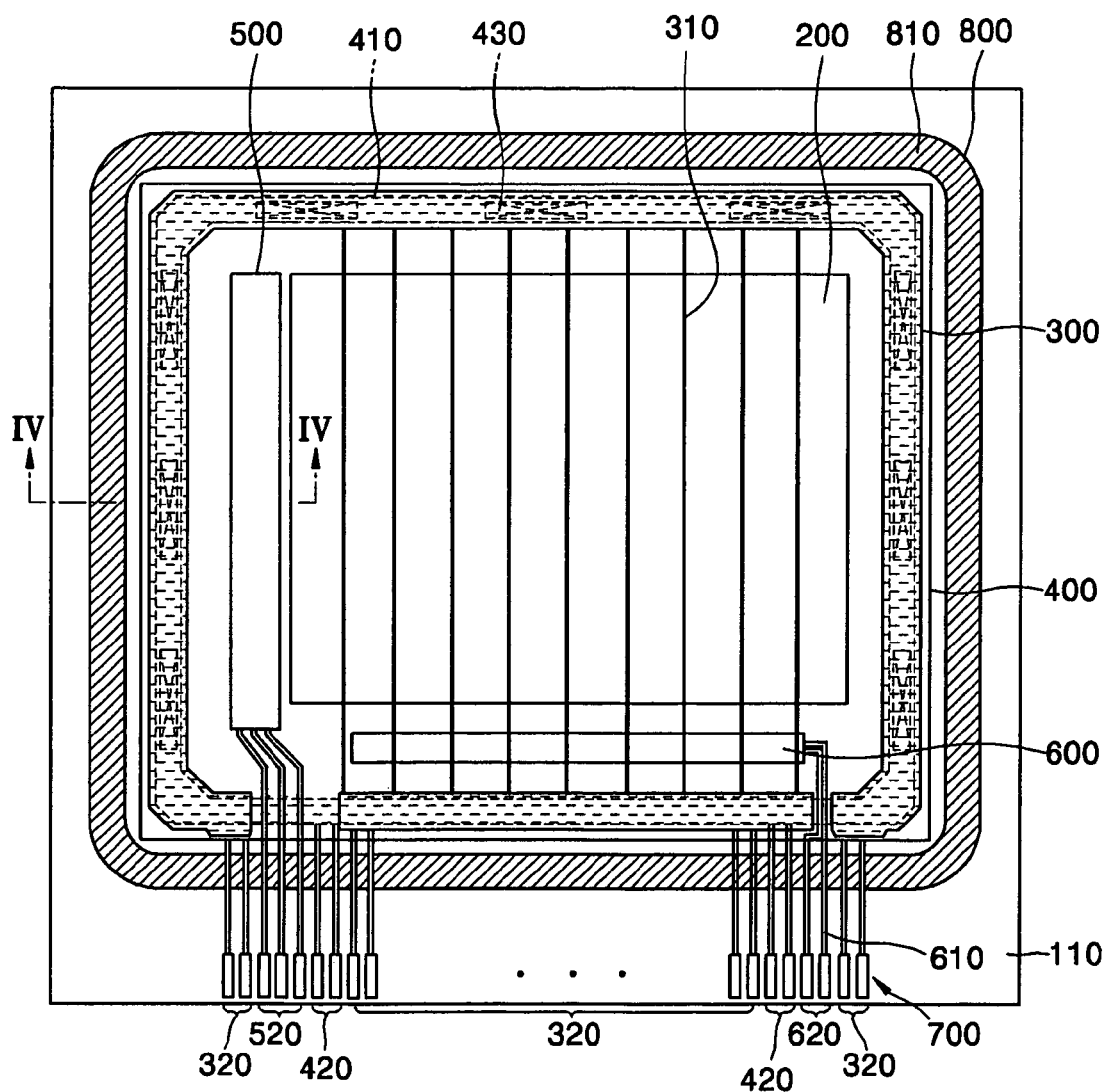
FIG. 4A is a schematic plan view of an electroluminescence display device according to another embodiment of the present invention.
Figure 4B:
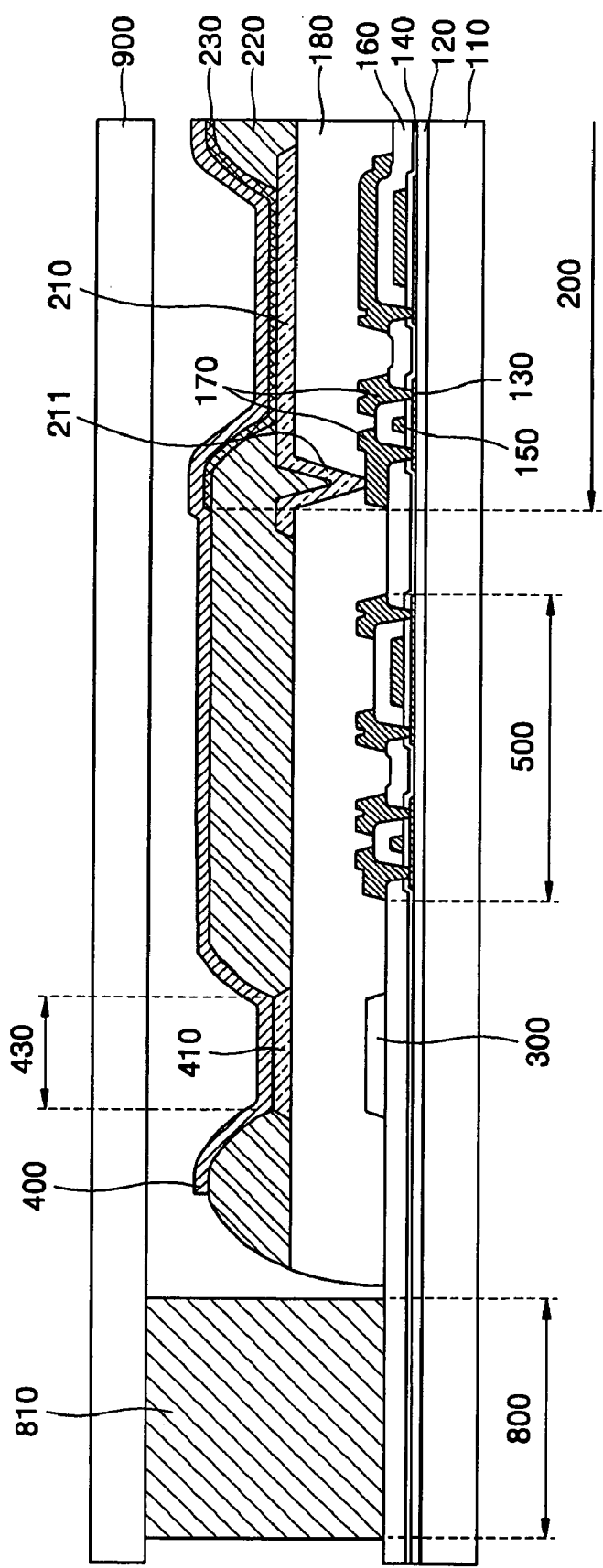
FIG. 4B is a schematic cross-sectional view taken along line IV-IV shown in FIG. 4A.

As shown in FIGS. 4A and 4B, the driving power supply line 300 may be selected as an electrical component having the electrode power supply line 410 disposed thereon. That is, the vertical driver 500 may be disposed at an outer periphery of the display area 200, the driving power supply line 300 may be disposed between the vertical driver 500 and the sealing portion 800, and the electrode power supply line 410 may be formed above at least a portion of the driving power supply line 300 simultaneously with the first electrode layer 210 of the display area 200.

The pixel definition layer 220 may be formed above the first electrode layer 210. The pixel definition layer 220 can cover at least a portion of the electrode power supply line 410, and may be interposed between the second electrode layer 400 and the electrode power supply line 410 (typically not yet formed when the pixel definition layer 220 is formed). An opening 430 may be formed on at least a portion of the driving power supply line 300 simultaneously with a pixel region of the display area 200.

The second electrode layer 400 can contact the power supply line 410 at the opening 430 in a direct contact manner, such as a plane-contact manner. That is, a contact between the second electrode layer 400 and the electrode power supply line 410 may occur over the driving power supply line 300.

In the above-described embodiments, in order to avoid interference between overlapping components, an insulating layer such as the protective layer 180 may be interposed between each of the electrode power supply line 410 and its underlying electrical components (for example, the vertical and horizontal drivers 500 and 600, the driving power supply line 410, and various other wirings).

The electrode power supply line may be formed on at least a portion of the outer periphery of the display area 200. The precise formation does not have to imitate what is shown in the figures.

If an electrode power supply is provided only at a side of the second electrode layer, a different voltage drop may be generated depending on the position of the second electrode layer. This voltage drop may cause luminance nonuniformity. In order to try to overcome this problem, the electrode power supply line and the second electrode layer can be arranged such that they contact symmetrically at both sides of the second electrode layer.

As shown in FIG. 4A, the electrode power supply line and the second electrode layer may preferably be disposed to form a closed curve. Also, if the pixel definition layer 220 extends to be interposed between the electrode power supply line 410 and the second electrode layer 400, a closed curve may be formed at the opening 430 where the electrode power supply line 410 and the second electrode layer 400 directly contact each other.

The electrode power supply line 410 and the second electrode layer 400 may contact in a plane-contact manner closed curve. This may reduce the voltage drop generated when electrode power is supplied. Consequently the problem of luminance nonuniformity in the display area may be alleviated. This arrangement may be particularly advantageous in a front emission type EL device. This may be because a transparent electrode made, for example, of ITO(which is weak in conductivity) may be typically used as the second electrode layer 400. However, the electroluminescent display device according to the present invention is not limited to a front emission type.

In another embodiment of the present invention, a front emission type EL device may comprise a first electrode layer 210 including one or more layers having at least a conductive reflective film. For example, the first electrode layer 210 may be prepared by forming a conductive reflective film having Al, Ag, or an alloy thereof entirely deposited thereon, and forming multiple layers of metal and/or metal oxide of Ni, Ir, Pt, Au, ITO, or IZO on the conductive reflective film. The structure of the first electrode layer 210 is not limited to the types described above and may have various types. In some cases, first electrode layer 210 may further include metal and/or metal oxide layers, e.g., Ni, ITO, or IZO, that are formed prior to formation of the conductive reflective film.

In this case, in order to ensure conductivity of the electrode power supply line 410, the electrode power supply line 410 may include at least a layer formed of the same material as the conductive reflective film of the first electrode layer 210. In other cases, the electrode power supply line 410 may include only the layer formed of the same material as the conductive reflective film of the first electrode layer 210.

If the electrode power supply line 410 includes a layer formed of the same material as the conductive reflective film of the first electrode layer 210, the conductive reflective film may be approximately 1000 Å or more thick. This may help to make the electrode power supply line 410 function properly by preventing an increase in contact resistance. In view of the processing requirements and the overall thickness dimensions, approximately 3000 Å may be a preferred thickness.

In another embodiment of the present invention, in order to further increase the proportion of the display area 200 to the panel, the driving power supply line 300 may include one or more conductive layers. At least some of the conductive layers may be formed between the sealing portion 800 and the substrate.

Figure 5A:
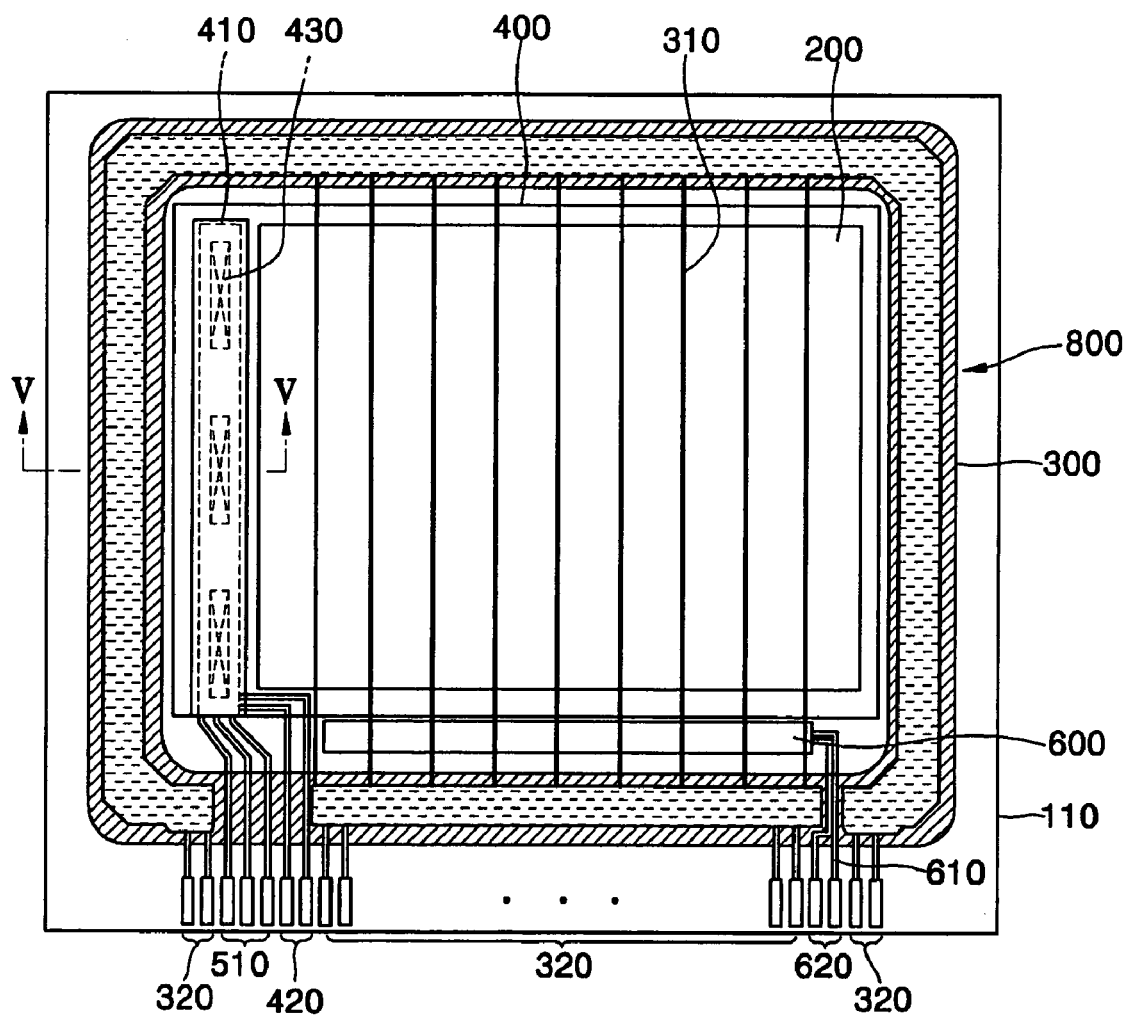
FIG. 5A is a schematic plan view of an electroluminescence display device according to still another embodiment of the present invention.
Figure 5B:
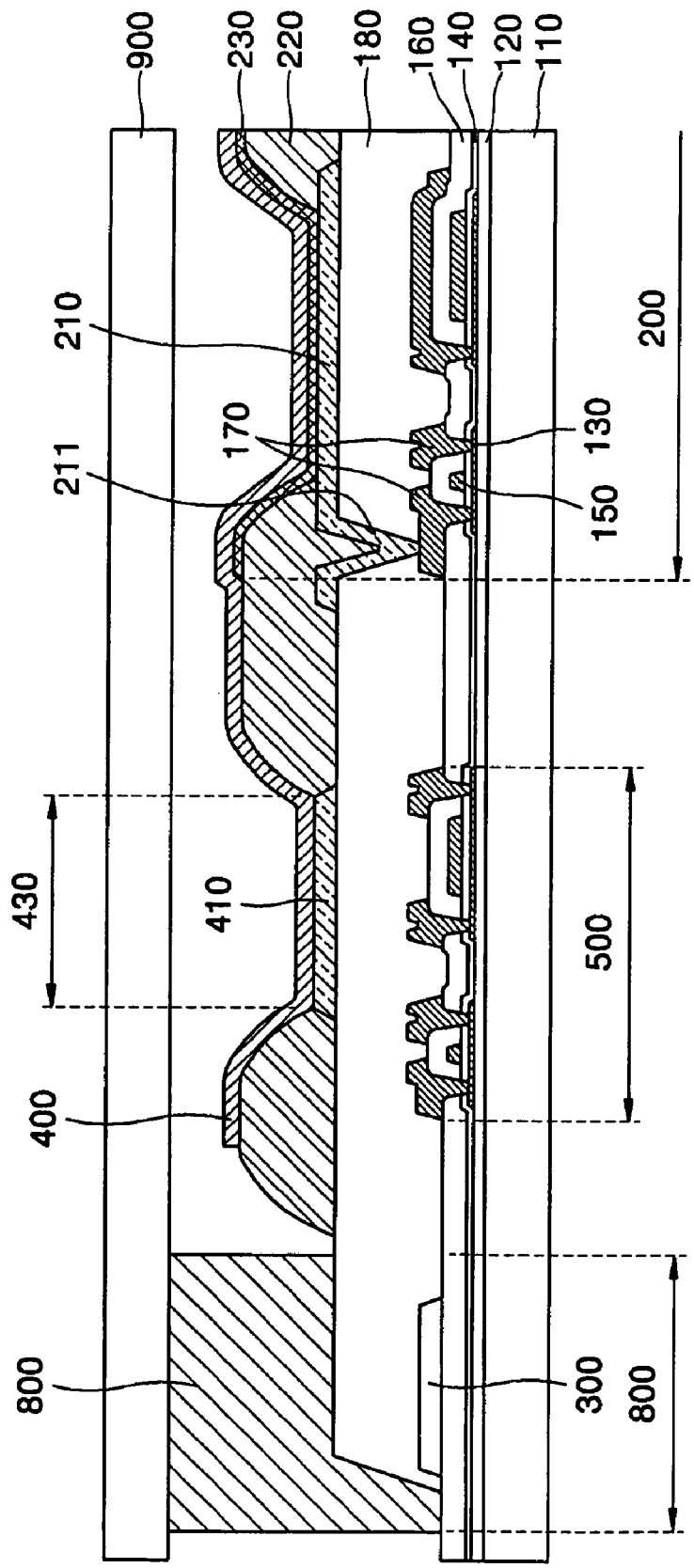
FIG. 5B is a schematic cross-sectional view taken along the line V-V shown in FIG. 5A.

As shown in FIGS. 5A and 5B, the driving power supply line 300 may be arranged so as to overlap a sealing portion 800 formed along an outer periphery of the display area 200. As shown in FIG. 5B, the driving power supply line 300 may be formed in the same plane as an interlayer 160 using the same material as that of source/drain electrode 170 of the display area 200. The configuration of the driving power supply line 300 is not limited to that shown in the illustrative embodiment, and can be modified as desired.

The driving power supply line 300 may include one or more layers formed of the same material as a semiconductor active layer 130, a gate electrode 150, or source/drain electrodes 170. When the driving power supply line 300 is formed of the same material as the source/drain electrodes 170, the driving power supply line 300 may be coated with a protective layer 180 so that the sealing member 810 and electric lines do not directly contact each other. This may help to prevent line damage due to contact with a sealing member 810.

As shown in FIG. 5A, the electrode power supply line 410 may overlap a driver circuit portion or the driving power supply line 300 that may overlap the sealing portion 800. This arrangement may further increase the ratio of display area to total panel size.

The above-described embodiments are provided only for illustrating the present invention and the present invention is not limited thereto. For example, the lay-out of the driving power supply line, the electrode power supply line, and the driver circuit portion can be changed or modified in various manners, while remaining with the scope of the present invention. While the embodiments have been shown and described with respect to organic electroluminescence display devices, the present invention can also be applied to other electroluminescent display devices without departing from the scope of the invention.

Although the present invention has been particularly shown and described with reference to preferred embodiments thereof, various changes in form and details may be made therein without departing from the scope of the present invention as defined by the following claims.

What is claimed is:

1. An electroluminescent display device, comprising:
a display area formed on one surface of a substrate with a first electrode layer, a second electrode layer, and an electroluminescent emission layer between the first electrode layer and the second electrode layer;
an electrode power supply line to supply electrode power to the display area, the electrode power supply line comprising a layer arranged along at least a portion of an outer periphery of the display area and being in direct contact with the second electrode layer; and
an electrical component arranged under the electrode power supply line, the electrical component comprising a conductive layer, wherein the electrode power supply line overlaps the electrical component,
wherein the electrical component is a driver circuit for applying an electric signal to the display area, and
wherein the conductive layer is arranged directly under the electrode power supply line.

2. The electroluminescent display device of claim 1, wherein the electrode power supply line comprises a same material as the first electrode layer.

3. The electroluminescent display device of claim 1, wherein the
conductive layer of the electrical component comprises a same material as other conductive layers in the display area.

4. The electroluminescent display device of claim 1, wherein the electrode power supply line comprises a closed curve along an outer periphery of the display area.

5. The electroluminescent display device of claim 1, wherein a pixel definition layer of the display area comprises a portion interposed between the second electrode layer and the electrode power supply line, and the second electrode layer and the electrode power supply line directly contact each other through an opening in the pixel definition layer over the electrode power supply line.

6. The electroluminescent display device of claim 1, wherein the opening comprises a closed curve along an outer periphery of the display area.

7. The electroluminescent display device of claim 1, wherein a planar surface of the second electrode layer contacts a planar surface of the electrode power supply line.

8. The electroluminescent display device of claim 1, wherein the electrical component includes a driving power supply line for supplying driving power to the display area.

9. The electroluminescent display device of claim 1, wherein the substrate transmits light generated from the emission layer.

10. The electroluminescent display device of claim 1, further comprising a sealing substrate facing the substrate, the sealing substrate to transmit light generated from the emission layer.

11. The electroluminescent display device of claim 1, wherein the first electrode layer comprises a conductive reflective film.

12. The electroluminescent display device of claim 11, wherein the conductive reflective film comprises a metal layer.

13. The electroluminescent display device of claim 11, wherein the conductive reflective film is approximately 1000 Å or more thick.

* * * * *